United States Patent
Chen

(10) Patent No.: US 7,652,936 B2
(45) Date of Patent: Jan. 26, 2010

(54) SIGNAL SAMPLING APPARATUS AND METHOD FOR DRAM MEMORY

(75) Inventor: Yi Lin Chen, Taipei (TW)

(73) Assignee: Realtek Semiconductor Corp., Hsinchu (TW)

( * ) Notice: Subject to any disclaimer, the term of this patent is extended or adjusted under 35 U.S.C. 154(b) by 27 days.

(21) Appl. No.: 11/675,572

(22) Filed: Feb. 15, 2007

(65) Prior Publication Data

US 2007/0201300 A1    Aug. 30, 2007

(30) Foreign Application Priority Data

Feb. 24, 2006    (TW) ............................. 95106240 A

(51) Int. Cl.
*G11C 7/00*   (2006.01)
*G11C 8/00*   (2006.01)
*G11C 8/18*   (2006.01)
*G11C 5/00*   (2006.01)

(52) U.S. Cl. .................... 365/193; 365/194; 365/233.1; 365/233.5; 365/233.13; 365/52

(58) Field of Classification Search ............... 365/52, 365/233.1, 233.11, 233.12, 233.13, 233.5, 365/193, 194, 189.05, 230.2
See application file for complete search history.

(56) References Cited

U.S. PATENT DOCUMENTS

| | | | |
|---|---|---|---|
| 5,959,932 A * | 9/1999 | MacLellan et al. ..... | 365/189.05 |
| 6,345,052 B1 * | 2/2002 | Tse et al. ................... | 370/465 |
| 6,417,698 B1 * | 7/2002 | Williams et al. ....... | 365/233.11 |
| 6,603,686 B2 * | 8/2003 | Yoo et al. ............... | 365/233.13 |
| 6,707,723 B2 * | 3/2004 | Jeong .................... | 365/189.05 |
| 7,038,953 B2 * | 5/2006 | Aoki ......................... | 365/194 |
| 7,133,324 B2 * | 11/2006 | Park et al. ............. | 365/185.13 |
| 7,266,022 B2 * | 9/2007 | Aoki ..................... | 365/189.05 |
| 7,286,441 B1 * | 10/2007 | White et al. ........... | 365/233.11 |
| 2007/0014342 A1 * | 1/2007 | Sindalovsky | |

* cited by examiner

*Primary Examiner*—Trong Phan
(74) *Attorney, Agent, or Firm*—Thomas, Kayden, Horstmeyer & Risley

(57) ABSTRACT

A signal sampling apparatus for a DRAM memory comprises a phase delay circuit adapted for receiving a data signal and delaying the data signal by a predetermined time to generate a delay signal; and a sampling circuit for sampling the data signal according to the delay signal.

18 Claims, 5 Drawing Sheets

SIGNAL SAMPLING APPARATUS AND METHOD FOR DRAM MEMORY

CROSS REFERENCE TO RELATED APPLICATION

This application claims the priority benefit of Taiwan Patent Application Serial Number 095106240, filed on Feb. 24, 2006, the full disclosure of which is incorporated herein by reference.

BACKGROUND OF THE INVENTION

1. Field of the Invention

This invention generally relates to a signal sampling apparatus and a method, and more particularly to a signal sampling apparatus and a method for a DRAM memory.

2. Description of the Related Art

FIG. 1 shows a schematic view of a conventional memory controller 10 coupled to a double data rate (DDR) memory 12. The memory controller 10 utilizes a bi-directional data strobe signal DQS to write a plurality of data signals $DQ_0$ to DQn into the DDR memory 12 or read out the plurality of data signals $DQ_0$ to DQn from the DDR memory 12.

In DDR memory standard, the DDR memory 12 can sample data from the data signals $DQ_0$ to DQn at each rising and falling edge of the data strobe signal DQS. Therefore, each rising edge and each falling edge of the data strobe signal DQS should occur while each of the data signals $DQ_0$ to DQn is steady within a data valid window so that the data of the data signals $DQ_0$ to DQn can be properly sampled.

Ideally, as shown in FIG. 2, the valid time T (e.g. time t1 to t2) of the data valid window for each of the data signals $DQ_0$ to DQn is fixed while the rising edge 14 and the falling edge 16 of the data strobe signal DQS respectively occur within the valid time T of two adjacent data valid windows (only one shown in FIG. 2), and furthermore, while occurs at the middle of the valid time T. For example, the rising edge 14 of the data strobe signal DQS occurs at the middle of the valid time T between the time t1 to t2. However, practically, when the memory controller 10 and the DDR memory 12 are disposed on a circuit board (not shown), the conducting lines printed on the circuit board for transmitting the data signals $DQ_0$ to DQn usually have different lengths due to circuit layout design, which may cause skews occurring between the data signals $DQ_0$ to DQn and thus result in the data valid window for each data signal to have different valid time as shown in FIG. 3.

As shown in FIG. 3, the valid time T1 (i.e. time t1 to t4) of the data valid window for the data signal DQ2 is the longest, and the valid time T2 (i.e. time t2 to t3) of the data valid window for the data signal DQn is the shortest among those for the data signals $DQ_0$ to DQn. In order to properly sample all of data from the data signals $DQ_0$ to DQn, the rising edge 14 of the data strobe signal DQS is limited to occur within the shortest valid time T2. In particular, when the data transmitting speed is increased between the memory controller 10 and the DDR memory 12, the above-mentioned limitation will cause the valid time or the timing margin of the data valid window to be insufficient.

Accordingly, the present invention provides a signal sampling apparatus and method for a DRAM memory whereby solving the above-mentioned problems in the prior art.

SUMMARY OF THE INVENTION

It is an object of the present invention to provide a signal sampling apparatus and method for a DRAM memory whereby solving the problem of the insufficient valid time or timing margin of the data valid window in the DRAM memory.

In order to achieve the above object, the present invention provides a signal sampling apparatus for a DRAM memory, which comprises a phase delay circuit and a data sampling circuit wherein the phase delay circuit is adapted for receiving a data signal and delaying the data signal by a predetermined time thereby generating a delayed signal; and the data sampling circuit is adapted for sampling the data signal according to the delay signal.

The present invention also provides a signal sampling method for a DRAM memory, comprising: providing a data signal; delaying the data signal by a predetermined time thereby generating a delayed signal; and sampling the data signal according to the delayed signal.

BRIEF DESCRIPTION OF THE DRAWINGS

Other objects, advantages, and novel features of the present invention will become more apparent from the following detailed description when taken in conjunction with the accompanying drawings.

DETAILED DESCRIPTION OF THE PREFERRED EMBODIMENT

Figure 4:
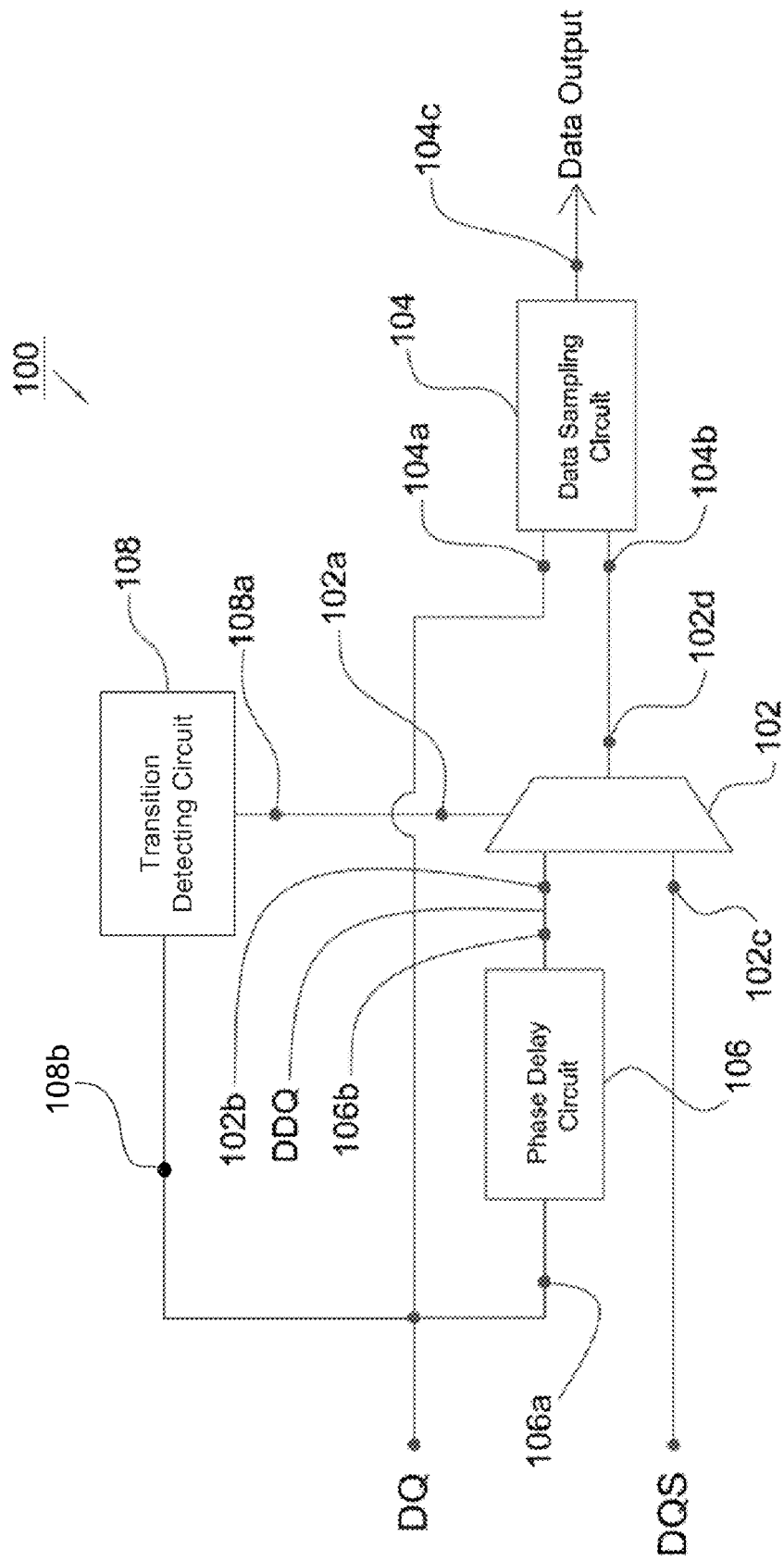
FIG. 4 shows a circuit block diagram of a signal sampling apparatus according to one embodiment of the present invention.

FIG. 4 is a circuit block diagram of a signal sampling apparatus 100 according to one embodiment of the present invention. The signal sampling apparatus 100 is disposed inside a double data rate (DDR) memory controller or a DDR memory (not shown) and includes a multiplexer 102, a data sampling unit 104, a phase delay circuit 106, and a transition detecting circuit 108.

Figure 1:
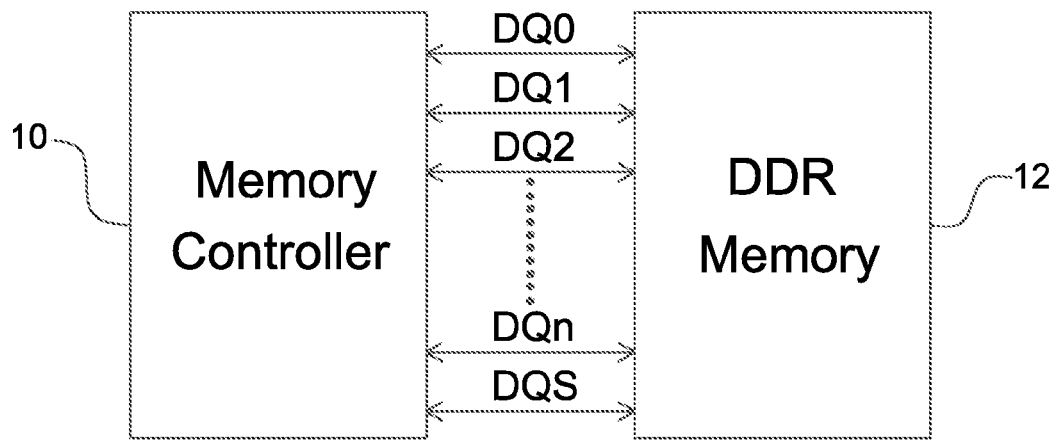
FIG. 1 shows a schematic view of a conventional memory controller coupled to a double data rate (DDR) memory.
Figure 2:
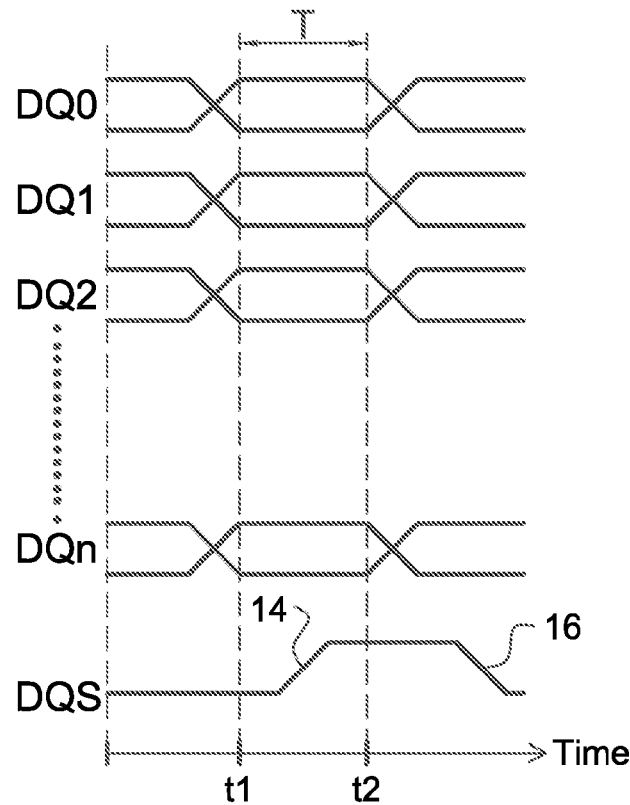
FIG. 2 shows the waveforms DQ0, DQ1, DQ2, DQn and DQS of FIG. 1 under an ideal condition.

In the signal sampling apparatus 100, the multiplexer 102 has a selection input 102a coupled to an output 108a of the transition detecting circuit 108, an input 102b coupled to the phase delay circuit 106, an input 102c for receiving a data strobe signal DQS, and an output 102d coupled to the data sampling unit 104. The data sampling unit 104 has a data input 104a for receiving a data signal DQ, a trigger input 104b coupled to the output 102d of the multiplexer 102 and an output 104c for outputting data, wherein the data signal DQ can be one of the data signals $DQ_0$ to DQn as shown in FIG. 1. The data sampling unit 104 can sample data from the data signal DQ received by the data input 104a when the rising edge or the falling edge of the signal received by the trigger input 104b occurs.

The phase delay circuit 106 has an input 106a for receiving the data signal DQ and an output 106b coupled to the input 102b of the multiplexer 102. The phase delay circuit 106 is adapted to delay the data signal DQ by a predetermined time and thus generate a delayed data signal DDQ, i.e. the data signal DQ delayed for the predetermined time, to be outputted from the output 106b to the input 102b of the multiplexer 102.

The transition detecting circuit 108 can regularly detect whether a transition edge, i.e. a rising edge or a falling edge, of the data signal DQ occurs. The transition detecting circuit 108 has an output 108a and an input 108b. When the detecting circuit 108 detects the occurrence of the transition edge of the data signal DQ at its input 108b, its output 108a outputs a low voltage level to the selection input 102a of the multiplexer 102 such that the multiplexer 102 outputs the delayed data signal DDQ, received from the input 102b, by the output 102d. On the contrary, when the detecting circuit 108 detects the absence of the transition edge of the data signal DQ, its output 108a outputs a high voltage level to the selection input 102a of the multiplexer 102 such that the multiplexer 102 outputs the data strobe signal DQS, received from the input 102c, by the output 102d.

Figure 5:
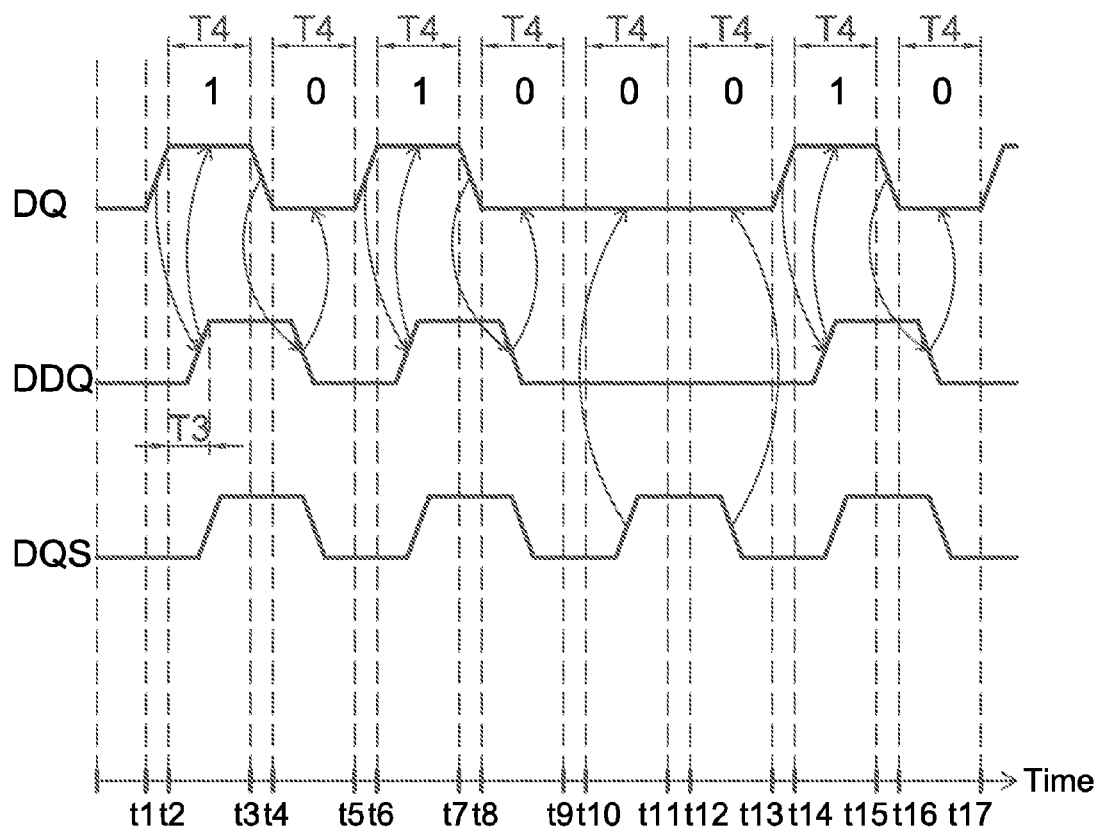
FIG. 5 shows the waveforms DQ, DDQ and DQS for illustrating the operation of the signal sampling apparatus shown in FIG. 4.

To illustrate the operation of the signal sampling apparatus 100, assuming that the data strobe signal DQS, the data signal DQ and the delayed data signal DDQ are shown as FIG. 5. The delayed data signal DDQ is delayed by a predetermined time T3 with respect to the data signal DQ through the phase delay circuit 106, and the data strobe signal DQS has been delayed in advance such that each rising edge and each falling edge of the delayed data signal DDQ and the data strobe signal DQS can occur within each data valid time T4 of the data signal DQ.

At time t0, the data signal DQ, the delayed data signal DDQ and the data strobe signal DQS are presented as low voltage levels.

During time t1 to t2, the transition detect circuit 108 detects the occurrence of a rising edge of the data signal DQ and thus outputs a low voltage level from the output 108a to the selection input 102a of the multiplexer 102 such that the delayed data signal DDQ is selected by the multiplexer 102 and outputted to the trigger input 104b of the data sampling unit 104. During time t2 to t3, the data signal DQ is presented as a high voltage level, which represents a data value of "1". During this period, the data sampling unit 104 is triggered by a rising edge of the delayed data signal DDQ, i.e. a rising edge delayed with respect to that of the data signal DQ during time t1 to t2, and then stores the data value of "1" received from its data input 104a.

During time t3 to t4, the transition detect circuit 108 detects the occurrence of a falling edge of the data signal DQ and thus outputs a low voltage level from the output 108a to the selection input 102a of the multiplexer 102 such that the delayed data signal DDQ is selected by the multiplexer 102 and outputted to the trigger input 104b of the data sampling unit 104. During time t4 to t5, the data signal DQ is presented as a low voltage level, which represents a data value of "0". During this period, the data sampling unit 104 is triggered by a falling edge of the delayed data signal DDQ, i.e. a falling edge delayed with respect to that of the data signal DQ during time t3 to t4, and then stores the data value of "0" received from its data input 104a.

Similarly, during time t5 to t6, the transition detect circuit 108 detects the occurrence of a rising edge of the data signal DQ such that the delayed data signal DDQ is outputted by the multiplexer 102 to the trigger input 104b of the data sampling unit 104. During time t6 to t7, the data sampling unit 104 is triggered by a rising edge of the delayed data signal DDQ, i.e. a rising edge delayed with respect to that of the data signal DQ during time t5 to t6, and then stores the data value of "1" of the data signal DQ received from its data input 104a. During time t7 to t8, the transition detect circuit 108 detects the occurrence of a falling edge of the data signal DQ. During time t8 to t9, the data sampling unit 104 is triggered by a falling edge of the delayed data signal DDQ, i.e. a falling edge delayed with respect to that of the data signal DQ during time t7 to t8, and then stores the data value of "0" of the data signal DQ received from its data input 104a.

During time t9 to t10, the transition detect circuit 108 detects the absence of any rising edge and falling edge of the data signal DQ and thus outputs a high voltage level from the output 108a to the selection input 102a of the multiplexer 102, such that the data strobe signal DQS is selected by the multiplexer 102 and outputted to the trigger input 104b of the data sampling unit 104. During time t10 to t11, the data signal DQ is presented as a low voltage level, which represents a data value of "0". During this period, the data sampling unit 104 is triggered by a rising edge of the data strobe signal DQS and then stores the data value of "0" received from its data input 104a. Please note that the multiplexer 102 is simply one embodiment of the present invention and should not be adapted to limit the scope of the present invention, and any circuit having the same function can also be adapted for achieving the object of the present invention.

Similarly, during time t11 to t12, the transition detect circuit 108 detects the absence of any rising edge and falling edge of the data signal DQ such that the data strobe signal DQS is still outputted by the multiplexer 102 to the trigger input 104b of the data sampling unit 104. During time t12 to t13, the data sampling unit 104 is triggered by a falling edge of the data strobe signal DQS and then stores the data value of "0" of the data signal DQ received from its data input 104a. The method of using the data strobe signal DQS to sample the data signal DQ is simply one embodiment of the present invention and should not be adapted to limit the present invention; any method, which can achieve the sampling function, can also be adapted for achieving the object of the present invention.

During time t13 to t14, the transition detect circuit 108 again detects the occurrence of a rising edge of the data signal DQ such that the delayed data signal DDQ is outputted by the multiplexer 102 to the trigger input 104b of the data sampling unit 104. During time t14 to t15, the data value of the data signal DQ is "1". The data sampling unit 104 is triggered by a rising edge of the delayed data signal DDQ, i.e. a rising edge delayed with respect to that of the data signal DQ during time t13 to t14, and then stores the data value of "1" received from its data input 104a.

Similarly, after time t15, the data sampling unit 104 will alternatively receive the delayed data signal DDQ or the data strobe signal DQS according to the detected results of the transition detect circuit 108 for the transition edge of the data signal DQ, such that the data of the data signal DQ can be sequentially sampled according to the rising edges and the falling edges of the delayed data signal DDQ or the data strobe signal DQS.

Figure 3:
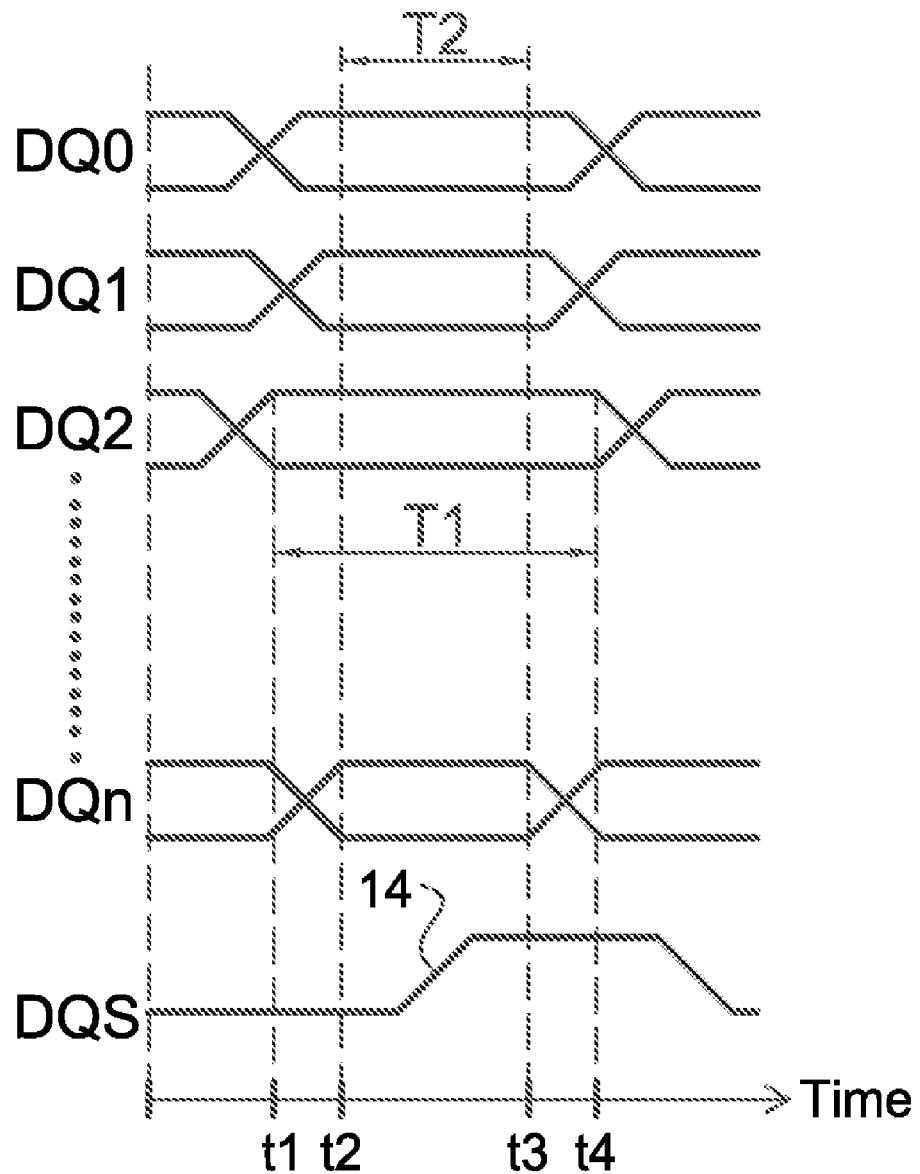
FIG. 3 shows the waveforms DQ0, DQ1, DQ2, DQn and DQS of FIG. 1 under a practical condition.
Figure 6:
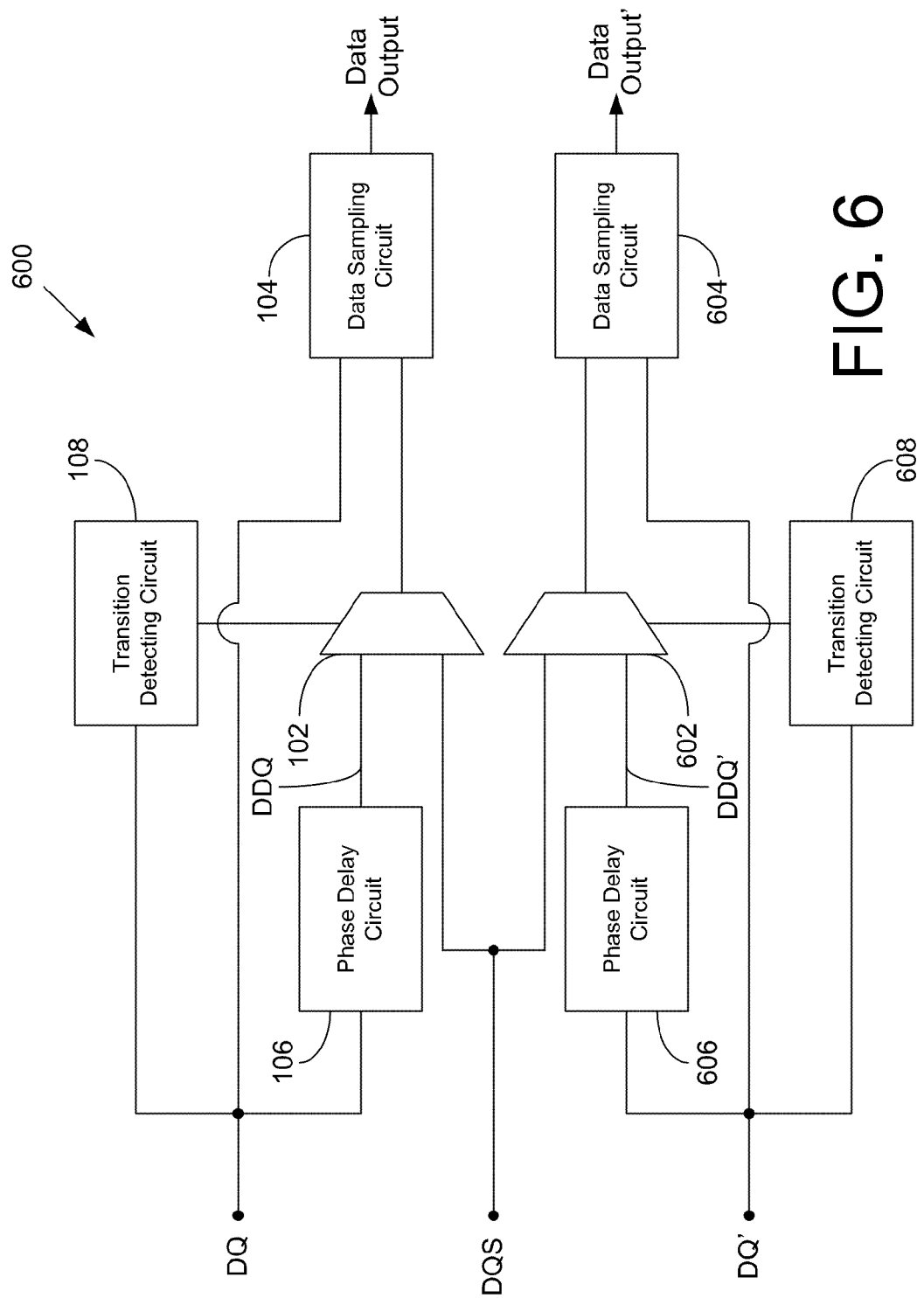
FIG. 6 shows a circuit block diagram of a signal sampling apparatus according to another embodiment of the present invention.

In the signal sampling apparatus 100 according to the embodiment of the present invention, when a transition edge, i.e. a rising edge or a falling edge, of the data signal DQ occurs, the data value of the data signal DQ can be sampled by a rising edge or a falling edge of a signal, i.e. the delayed data signal DDQ, delayed with respect to the data signal DQ. Therefore, if the data signals $DQ_0$ to DQn as shown in FIG. 3 are sampled respectively through a plurality of signal sampling apparatus 100, data sampling is finished without completely using the data strobe signal DQS such that the problem of the insufficient valid time or the timing margin of the data valid window caused by the data strobe signal DOS can be solved. To this end, FIG. 6 illustrates a signal processing apparatus 600 incorporating a plurality of multiplexers 102, 602, a plurality of data sampling circuits 104, 604, a plurality of phase delay circuits 106, 606, and a plurality of transition detecting circuits 108, 608. The signal processing apparatus 600 is configured to process data signals DQ and DQ' in order to generate data output and data output' respectively. The signal processing apparatus 600 operates on each data signal DQ and DQ' as the signal processing apparatus 100 operates on data signal DQ as described above. For example, phase delay circuit 606 produces delayed data signal DDQ'. Signal processing apparatus 600 may be viewed as incorporating a plurality of signal processing apparatuses 100.

In addition, when the transition of the data signal DQ is absent, the data value of the data signal DQ is sampled by a rising edge or a falling edge of the data strobe signal DQS. However, when the transition of the data signal DQ is absent, the data value remains a fixed value, e.g. the data value of "0" during time t8 to t13 as shown in FIG. 5, such that the data values can be properly sampled when the rising edge or the falling edge of the data strobe signal DQS occurs at any time within the data valid time of the fixed value, which can also improve the problem of the insufficient valid time or the timing margin of the data valid window caused by the data strobe signal DQS.

In addition, the signal sampling apparatus and method according to the embodiments of the present invention are not limited to be disposed or applied to the DDR memory or the DDR memory controller; they can also be applied to any dynamic random access memory (DRAM) or any DRAM controller. Furthermore, the data strobe signal DQS and the data signal DQ can be any data control signal and data signal in any other type of DRAM controller circuit or DRAM circuit, and are not limited to the data strobe signal DQS and the data signal DQ under the DDR memory standard.

Although the invention has been explained in relation to its preferred embodiment, it is not adapted to limit the invention. It is to be understood that many other possible modifications and variations can be made by those skilled in the art without departing from the spirit and scope of the invention as hereinafter claimed.

What is claimed is:

1. A signal sampling apparatus, comprising:
   a phase delay circuit for receiving a data signal and delaying the data signal by a predetermined time to thereby generate a delayed data signal;
   a transition detecting circuit for detecting a transition edge of the data signal to generate a control signal according to a detecting result;
   a selecting circuit for receiving the delayed data signal generated by the phase delay circuit and a data strobe signal to generate a selected signal out of the delayed data signal and the data strobe signal; and
   a sampling circuit for sampling the data signal according to the selected signal generated by the selecting circuit;
   wherein the selecting circuit receives the control signal from the transition detecting circuit, and selects the delayed data signal as the selected signal when the transition edge of the data signal is detected and selects the data strobe signal as the selected signal when no transition edge of the data signal is detected.

2. The signal sampling apparatus as claimed in claim 1, wherein the data signal is a data signal DQ in a DDR memory.

3. The signal sampling apparatus as claimed in claim 1, wherein the selecting circuit comprises a multiplexer.

4. The signal sampling apparatus as claimed in claim 1, which is disposed in a DDR memory controller.

5. The signal sampling apparatus as claimed in claim 1, which is disposed in a DDR memory.

6. A signal sampling method, comprising:
   receiving a data signal and delaying the data signal by a predetermined time to thereby generate a delayed data signal;
   receiving the delayed data signal and a data strobe signal to generate a selected signal out of the delayed data signal and the data strobe signal;
   detecting a transition edge of the data signal to generate a control signal according to a detecting result;
   selecting the delayed data signal as the selected signal when the transition edge of the data signal is detected and selecting the data strobe signal as the selected signal when no transition edge of the data signal is detected, the selecting performed according to the control signal; and
   sampling the data signal according to the selected signal.

7. The signal sampling method as claimed in claim 6, wherein the data signal is a data signal DQ in a DDR memory.

8. The signal sampling method as claimed in claim 6, wherein the data signal is a data signal DQ in a DDR memory.

9. The signal sampling method as claimed in claim 6, which is applied to a DDR memory controller.

10. The signal sampling method as claimed in claim 6, which is applied to a DDR memory.

11. A signal sampling apparatus, comprising:
    a delay circuit being coupled to a signal for delaying the signal by a predetermined time to thereby generate a delayed signal;
    a transition detecting circuit being coupled to the signal for detecting a transition of the signal; and
    a sampling circuit for sampling a value of the signal by utilizing the delayed signal generated by the delay circuit as a sampling trigger when a transition of the signal occurs according to the transition detecting circuit, and by utilizing a periodic strobe as the sampling trigger when a transition of the signal is absent according to the transition detecting circuit.

12. The signal sampling apparatus of claim 11, wherein the transition detecting circuit is further for regularly detecting the transitions of the signal between valid data times of the signal.

13. The signal sampling apparatus of claim 11, further comprising a selecting circuit, being coupled to the transition detecting circuit and the sampling circuit, for continuously selecting between the delayed signal and the periodic strobe to thereby generate the sampling trigger according to whether or not transitions of the signal are detected by the transition detecting circuit.

14. The signal sampling apparatus of claim 13, wherein the selecting circuit comprises a multiplexer having two input terminals being respectively connected to the delayed signal and the periodic strobe, a control terminal being connected to an output of the transition detecting circuit, and an output terminal for generating the sampling trigger being coupled to the sampling circuit.

15. The signal sampling apparatus of claim 11, wherein the transition detecting circuit is further for detecting the transitions of the signal by detecting both rising and falling edges of the signal.

16. The signal sampling apparatus of claim 11, being disposed within a DDR memory, wherein the signal is a data signal DQ and the periodic strobe is a data strobe signal DOS.

17. The signal sampling apparatus of claim 11, being disposed within a DDR memory controller, wherein the signal is a data signal DQ and the periodic strobe is a data strobe signal DOS.

18. The signal sampling apparatus of claim 11, further comprising:
- a plurality of delay circuits, each delay circuit being coupled to a unique signal for delaying the unique signal by the predetermined time to thereby generate a plurality of delayed signals;
- a plurality of transition detecting circuits, each transition detecting circuit being respectively coupled to one of the unique signals for detecting transitions of the one of the unique signals; and
- a plurality of sampling circuits, each sampling circuit for sampling a value of one of the unique signals by utilizing the delayed signal generated by the respective delay circuit and corresponding to the unique signal as the sampling trigger when a transition of the unique signal occurs as determined by the respective transition detecting circuit, and by utilizing the periodic strobe as the sampling trigger when a transition of the unique signal is absent as determined by the respective transition detecting circuit.

\* \* \* \* \*